United States Patent [19]

Owen et al.

[11] Patent Number: 5,710,710
[45] Date of Patent: Jan. 20, 1998

[54] FREQUENCY COUNTER WITH REDUCED FALSE CORRELATIONS

[75] Inventors: William P. Owen, Fort Lauderdale; Judd Sheets, St. Petersburg, both of Fla.

[73] Assignee: Optoelectronics, Inc., Fort Lauderdale, Fla.

[21] Appl. No.: 561,692

[22] Filed: Nov. 22, 1995

Related U.S. Application Data

[63] Continuation-in-part of Ser. No. 310,228, Sep. 21, 1994, Pat. No. 5,471,402.
[51] Int. Cl.⁶ .......................... G01R 23/00; G06F 17/00
[52] U.S. Cl. .................. 364/484; 324/76.48; 324/76.62; 324/76.74
[58] Field of Search ...................... 464/484, 485, 464/486, 487; 324/76.42, 76.47, 76.48, 76.58, 76.62, 76.74

[56] References Cited

U.S. PATENT DOCUMENTS

| | | | |
|---|---|---|---|
| 4,027,146 | 5/1977 | Gilmore | 364/484 |
| 4,350,950 | 9/1982 | Waldmann et al. | 324/76.61 |
| 4,424,482 | 1/1984 | Drogin | 324/76.47 |
| 4,651,089 | 3/1987 | Haigh | 324/76.42 |
| 4,882,740 | 11/1989 | Abe et al. | 24/76.48 |
| 5,323,104 | 6/1994 | Lindell | 324/76.42 |
| 5,373,236 | 12/1994 | Tsui et al. | 324/76.42 |
| 5,379,390 | 1/1995 | Searing et al. | 364/484 |
| 5,471,402 | 11/1995 | Owen | 364/484 |

*Primary Examiner*—Vincent N. Trans
*Attorney, Agent, or Firm*—Malin, Haley, DiMaggio & Crosby, PA

[57] ABSTRACT

An improved frequency counter for more reliably reading the frequency of low level signals by employing a method of separating the desired signal from undesirable noise related signals, wherein the frequency counter comprises signal input amplifier circuitry, a frequency modulator circuit for phase shifting the self-oscillation frequency of the undesired signal to isolate it from the valid signal, a prescaler circuit, a frequency or pulse counter driven by the output of the prescaler, and a correlator circuit for differentiating the self-oscillation frequencies from the main signal frequency so as to reduce false correlations between the self-oscillation, or noise, and valid signals.

19 Claims, 3 Drawing Sheets

FREQUENCY COUNTER WITH REDUCED FALSE CORRELATIONS

This application is a continuation-in-part of U.S. application Ser. No. 08/310,228, filed Sep. 21, 1994 now U.S. Pat. No. 5,471,402.

BACKGROUND OF THE INVENTION

1. Field of the Invention

This invention generally relates to an improved frequency counter, and more particularly, to an improved frequency counter having a modulator circuit for shifting the self-oscillation frequency of an undesired signal and a correlator circuit for differentiating the self-oscillation frequencies from the desired signal frequency to improve the overall accuracy of the frequency counter by reducing false correlations between the self-oscillation and desired signal frequencies.

2. Description of the Background Art

A frequency counter is a test instrument which measures a frequency of an electrical signal. Frequency counters typically measure frequency by counting the number of cycle pulses crossing a predetermined voltage threshold, usually zero volts, over a precise time interval. The input signal is normally conditioned by known input circuitry, such as a Schmitt trigger circuit, which receives an input signal and outputs one pulse per cycle of input. A problem noted by conventional frequency counters is their inability to accurately measure the frequency of low level signals. These signals are difficult to accurately measure for several reasons. First, low level input signals must be amplified to produce pulses which will cross the cycle count triggering threshold. A large amount of gain is required to best count these low level signals but the realization of this gain introduces broadband noise which is added to the desired signal. Second, incidental coupling around the input circuitry can also form near oscillatory paths. Finally, the prescalers used in some types of frequency counters include input circuits that tend toward oscillation in the absence of an overriding input signal. All of these factors combine to form a complex input signal that is hard to distinguish from a desired signal. This self generated signal is here referred to as self-oscillation. As a result, the frequency counter may experience problems differentiating the main signal readings from self-oscillation readings since amplified self-oscillations can cause the counter to trigger and produce random measurements. This problem of making false readings is further aggravated with increasingly sophisticated frequency counters having higher sensitivity for measuring lower level signals.

Self-oscillation is a byproduct of amplifying signals, especially low level signals, as noted above. The amplifier circuit produces noise which for large values of gain can be incidentally fed back from the output into the input resulting in an increase in noise output levels and noise peaks. Since it is amplified into a relatively strong signal, this self-oscillation is readable by the counter. The self-oscillation signal also varies in apparent center frequency with a variety of factors, including antenna impedance, antenna coupling, amplifier gain, etc. Consequently, this self-oscillation signal produces serious difficulties in distinguishing the counts of self-oscillation from those of true input signals of arbitrary frequency.

Other reasons also exist for the inaccurate readings of low level signals. For instance, prescalers used in conventional counters typically include regenerative input circuits to make the prescaler more sensitive. Regeneration in a circuit refers to partial feedback of an output signal to the input. Unfortunately, this regeneration cannot be suppressed without forfeiting needed sensitivity in the counter, since the prescaler feeds the signal pulses to the counter. By contrast, high level signals usually have a signal amplitude that overrides any self-oscillation, thereby increasing the likelihood of correct counts or readings. The difficulties in accurately measuring frequency of low level signals, and the increased sensitivity and amplification required for measuring low level signals contribute to false correlations and inaccurate measurements.

In certain manually operated counters, the operator may be familiar with the input signal and expect a certain frequency count so that adjustments to the counter, such as a threshold signal level or sensitivity, can be made in anticipation of the input signal's amplitude and frequency to increase the probability of correct readings. The problems discussed herein are more apparent with automated frequency counters and increasingly sophisticated frequency counters with higher sensitivity and improved amplifiers that allow the frequency counter to receive lower level signals, such as signals received from an antenna. Although recent advances in counter technology have allowed better frequency measurements of smaller input signals, achieving more accurate readings consistently is still problematic because of the difficulty in distinguishing the desired signals from the self-oscillations present in low level signals. The inventor herein has offered architecture in frequency counters for differentiating self-oscillations from valid input signals. In inventor's application Ser. No. 08/310,228, filed Sep. 21, 1994, the frequency counter employs a statistical comparison circuit which discriminates the main signal from the self-oscillation by comparing successive measurements, looking for consistency, so that only valid counts are displayed to the user. While the statistical comparison circuit can compare and correlate successive measurements to find consistency in results, eventually a series of random counts could appear to be correlated and passed as valid. That is, if an inaccurate reading is duplicated by the multiple reoccurrence of similar self-oscillating signals and/or noise, they could be recorded incorrectly as valid frequency measurements if repeated enough. It has been noted, however, that self-oscillation frequency counts typically center around some nominal frequency value, as determined by the factors described that lead to its generation, with some variation from count to count. If invalid signal samples could be shifted upon command, then self-oscillation counts may be shifted and compared to unshifted counts to reduce false correlations and readings. So, although statistical comparison circuitry can discriminate uncorrelated signals such as noise from the desired signal, a frequency counter further able to separate the desired signal from the self-oscillations would further discriminate the signals and reduce false correlations. Such a frequency counter would represent a further improvement in frequency counters and would be well received.

Accordingly, the present invention provides an improved frequency counter that provides increased efficiency over known frequency counters by distinguishing a desired signal from self-oscillations through frequency modulation techniques, which may or may not be used together with the statistical comparison circuit disclosed in application Ser. No. 08/310,228. The instant invention differentiates valid signals from self-oscillating signals by attempting to shift the average frequency of the self-oscillation and correlating variations seen in the resulting counts.

SUMMARY OF THE INVENTION

The present invention represents an improvement in frequency counter technology, whereby it incorporates and integrates signal input circuitry, a modulator circuit, a prescaler, a frequency or pulse counter, and a correlator, to reduce and/or prevent false correlations between readings by shifting self-oscillation counts inherent in amplified low level signals to distinguish them from the main signal counts. The concept of the instant invention is based on shifting the probability distribution of counts taken from the input signals so that it becomes less likely for successive counts of self-oscillation signals to match. As is known in the art, a signal is received, amplified, and converted to pulses by a circuit such as the Schmitt trigger. In correlating readings, a number of counts are taken and are usually found to center around a particular frequency. The instant invention is an improvement in frequency counter technology, whereby it includes a frequency modulator circuit that reduces false correlations by broadening the count distribution of the self-oscillating signals and further differentiating them from a desired signal. Signal shift is accomplished by modulating the self-oscillation counts and forcing said count distributions to center on a different frequency value. In essence, the instant invention bifurcates the probability density function so as to make the probability of matching inaccurate successive counts smaller, thereby reducing the likelihood of producing false correlations.

In accordance with these and other objects which will become apparent hereinafter, the instant invention will now be described with particular reference to the accompanying drawings.

DESCRIPTION OF THE PREFERRED EMBODIMENTS

Figure 1:
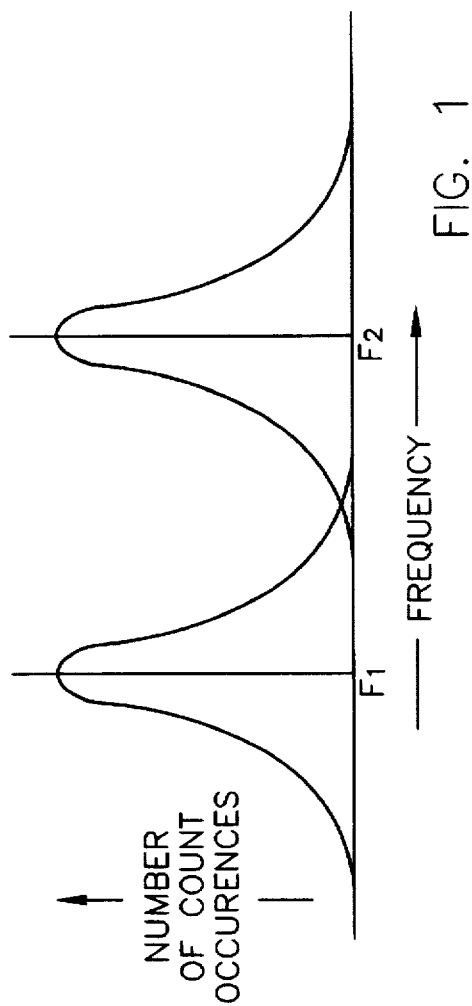
FIG. 1 is a graphical illustration of the probability density functions of successive signal frequency counts at a first frequency and a shifted frequency.

With reference to the drawings, FIGS. 1–4 illustrate the instant invention. With reference to FIG. 1, probability density functions of representative count occurrences are monitored and plotted, whereby the left distribution function plot represents the determined self-oscillation counts. It can be seen from the left curve that most measurements of a self-oscillation signal may center around one frequency, such as F1 as illustrated by way of example in FIG. 1. For example, if two successive counts are taken from the left distribution or curve, compared and tested to be within an arbitrary amount of each other, it can be assumed that eventually two random counts will be sufficiently close and be accepted as valid and correct readings. If, on the other hand, the second of these two counts was taken from distribution F2, the probability of correlation is much less, depending on the amount of overlap with the two probability functions.

With reference to FIG. 1, the probability density functions plotted represent arbitrary functions that may be produced by successive readings from the frequency counter. The Gaussian function graph serves to illustrate the principles involved in the instant invention, which include distinguishing a valid signal from error producing self-oscillations. Since the center of a probability density function of counted frequency occurrences is easily influenced, it can be shifted around by frequency modulation means. With reference to FIG. 1, if the density function can be moved sufficiently so that there is little overlap between the two functions, it is unlikely that a count taken from each of the two displaced functions will match within the acceptable threshold count differentials. The count differential is the maximum difference allowed between successive counts by the correlator 62. In accordance with the instant invention, the modulator applies a dither signal to the counter input circuitry 20 that displaces the density function of the input signal so that counts taken from the original and displaced frequency distribution F1 and F2 will center around different frequencies and will be less likely to fall within a preset tolerance that is used to accept readings as valid. The amount of frequency offset required is directly related to the degree of false count immunity required. That is, the smaller the shift, the more likely false readings will occur. Since these distribution functions essentially tail off infinitely in each direction, it is impossible to guarantee zero false counts. However, in practice, it has been found that false counts may be reduced from several per hour without the use of the modulator circuit 30 to less than one per day when utilizing the modulator circuit 30.

Accordingly, since the counter is intended to measure frequency, the instant invention attempts to frequency modulate the self-oscillations. If the self-oscillation counts are modulated by the modulator 30, they will not pass the correlator test and as a result, they will be rejected. Finally, it should be noted that any form of phase or frequency modulation may be used. The purpose of the dither or modulation achieved by the modulator 30 is to center frequency counts around separated frequencies. In the instant invention, the modulation chosen is binary, that is, the modulator circuit 30 is either turned on or off. However, any form of modulation of the self-oscillations can be used, such as a sine wave, which linearly varies the self-oscillation frequency over a range of values. As long as the modulator 30 can effectively and sufficiently displace the probability density function so that there is little overlap at the extreme ends of the modulation applied, the modulator 30 will achieve the purposes of the instant invention.

Figure 3:
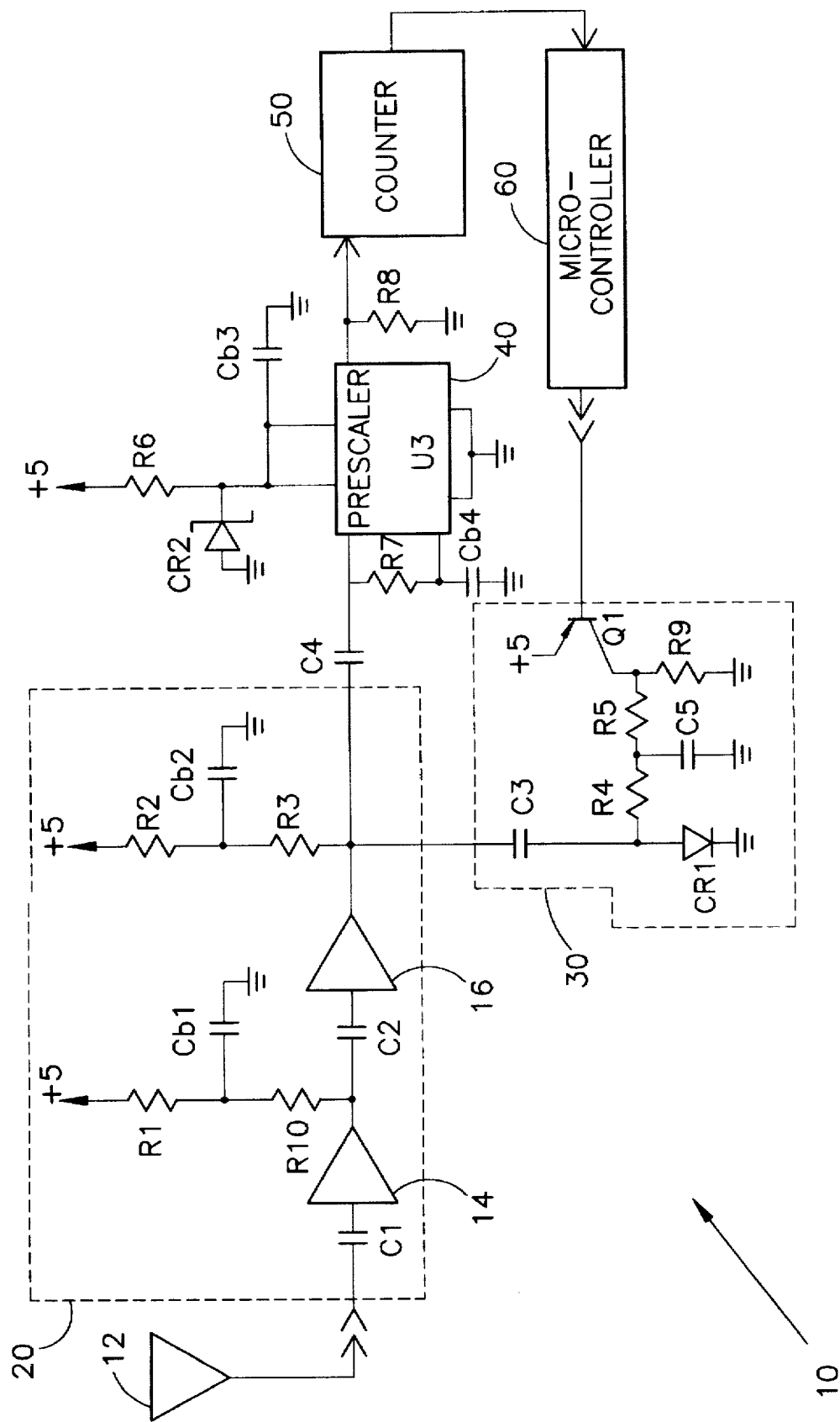
FIG. 3 is an electrical circuit diagram of the instant invention.

Several methods may be used to modulate the self-oscillation. Since the self-oscillation frequency is not controlled by any particular high Q resonance, it is easy to move the frequency within a small range. All that is required is moving the frequency enough so that the overlap between probability density functions is small. Modulation can be linear over a range of values or binary in the simple modulated or un-modulated case. With reference to FIG. 3, the actual method used to effect the frequency modulation may vary, but it typically consists of a varactor or PIN diode CR1 and switched capacitor C3 used to change the relative phase of a signal passing through the counter input circuitry. The preferred location for this PIN diode CR1 and switch capacitor C3 is at the junction of the input amplifier and prescaler input since there it can change the relative phase of both the overall antenna to prescaler loop and the prescaler input reflection phase. It is desirable that the method of modulation chosen not impair the sensitivity of the counter under any condition.

Regardless of the modulation technique employed, the modulation shifts and effectively broadens the distribution of counts to greatly reduce the probability of false correlations. The modulation drive signal originates in the microcontroller 60 and effects the modulation on alternate counts. The desired signals will be measured and correlated normally since their frequency is independent of the self-oscillation frequency and not affected by the modulation.

Figure 2:
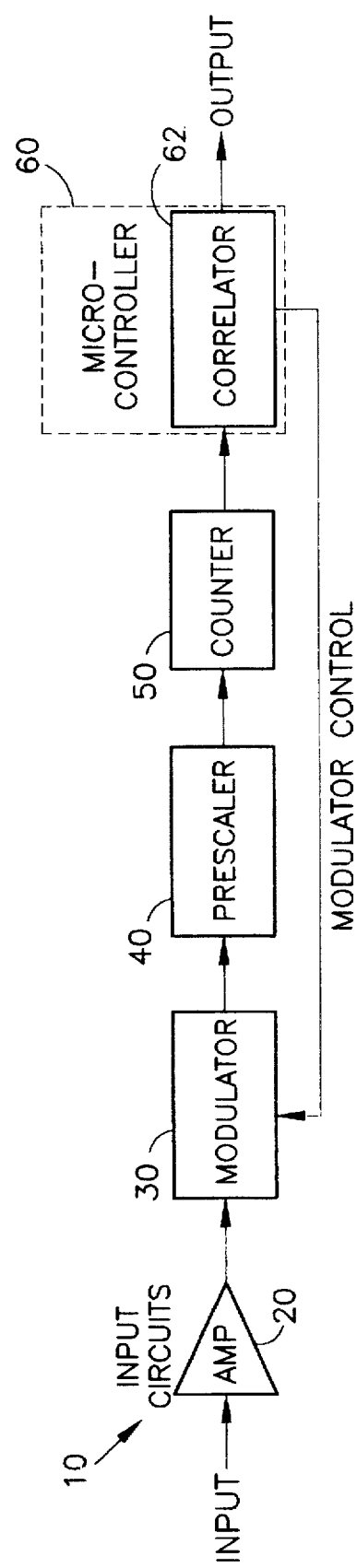
FIG. 2 is an electrical block diagram of the frequency counter of the instant invention.

The preferred block diagram of the instant invention is shown in FIG. 2. Input signals are fed through at least a single stage amplifier 14 the output of which is electrically associated with the modulator 30. The prescaler 40 is driven by the modulator 30 output and the prescaler 40 output is fed into the counter 50. The counter 50 is a frequency measurement means and provides a measurement of the signal after it has been amplified, modulated and prescaled. If the modulator 30 is activated, then it experiences a phase prior to being measured. The signal is then passed through the correlator 62 and fed to an output for further processing by the microcontroller 60 and possible display. Except for the correlator 62 and modulator 30 sections, the block diagram is that of a typical high frequency counter. The modulator 30 is used to shift the self-oscillation frequency slightly by varying the phase of the self-oscillation loop. If a valid signal is applied to the input, then the modulator 30 has no effect and the signal is counted as normal.

Figure 4:
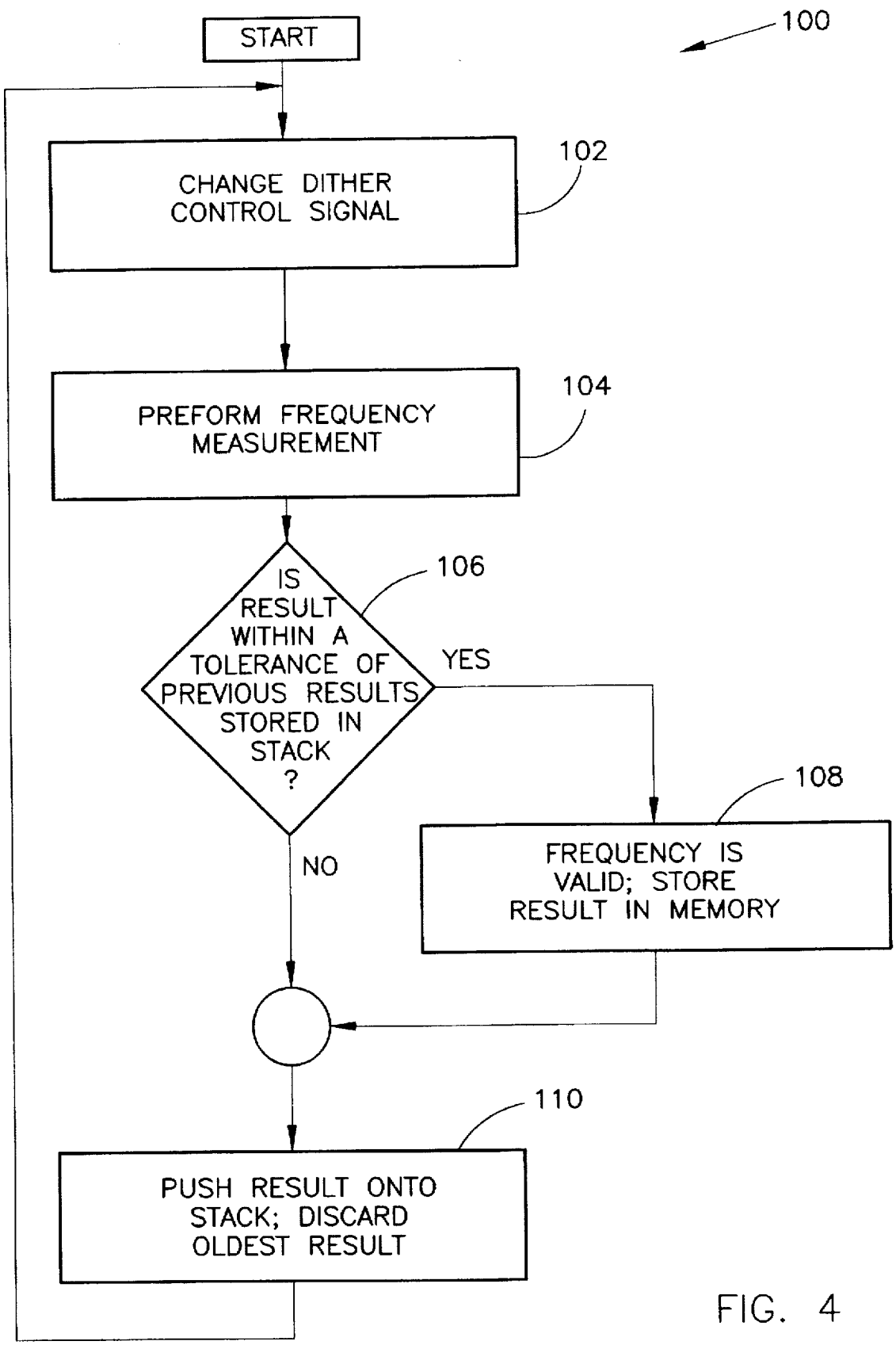
FIG. 4 is a flow chart of operation of the instant invention.

With reference to FIG. 4 of the instant invention, the correlator 62 comprises a statistical comparison means, similar to that described in the parent case, for correlating pulse counts. It may comprise a set of instructions executable by the microcontroller 60. The modulator 30 is triggered by the microcontroller 60 for shifting the self-oscillating frequency. The amplifier 20, prescaler 40, and counter 50 may comprise known components. The counter 50, correlator 62, and output have electrical connections which comprise digital data paths.

A typical low amplitude input signal is received through an antenna 12 and, thus, requires amplification. Generally, since a frequency counter operates by counting zero crossings of the input signal, proper operation will only occur with a single dominant signal since multiple simultaneous signals will confuse the zero crossing detector. Input signal samples are amplified by the input circuits 20 to a level sufficient for driving the zero crossing detector present in the prescaler 40 and counter 50. The modulator 30 changes the relative phase shift of the self-oscillation loop and hence alters the frequency when it is activated to produce a difference, as seen in FIG. 1 and discussed above, so as to generate a shifted count which is compared with subsequent counts. The modulator 30 is activated and deactivated by the microcontroller 60 which drives a control signal output to the modulator 30. The modulator 30 is designed so as to not substantially affect the amplitude of the input signals.

Since the counter 50 cannot count signals of high frequency efficiently, the prescaler 40 is used to reduce the frequency applied to the counter 50 by delivering one output pulse for each N number of input pulses. The number N can be any number, but is typically 4, 8, 16, 32, or 64. In the specific application of the instant invention, an N number of 8 is preferred. Thus, barring other restrictions, the maximum input frequency measurement capability is eight times that of the counter section alone. The counter 50 counts the number of prescaler 40 output pulses that occur in a given gate time. The gate time of the counter 50 may be operator selected to yield the desired resolution, with resolution and gate time being directly proportional.

The count data from the counter 50 is fed to the correlator 62, which is implemented as part of the microprocessor controller. The correlator 62 compares the counter frequency data with previous readings, as discussed with reference to FIG. 4. The modulator 30 is triggered by the correlator 62 through a control signal generated by the microcontroller 60 and fed through a transistor Q1 so as to provide a digital signal to activate the PIN diode CR1. The diode CR1 switches a small capacitor C3 in and out of the circuit to activate and deactivate the modulator circuit 30. The counter 50 takes one count with the modulator 30 in the off state and another with the modulator 30 in the active state, and if the counts are found to be different by a predetermined amount, the count is deemed invalid and the result of self-oscillation. As noted above, when the modulator 30 is on, if only self oscillation signals are present the count is shifted from the count achieved when the modulator is off. Consequently, it is the object of the instant invention to distinguish the main signal from self-oscillations, whether the self-oscillations are the result of regeneration from the amplifier circuit, noise, or other signals, so that a valid frequency count can be obtained from the input signal of interest.

With reference to FIG. 3, the receiving antenna 12, the amplifier 20, the modulator 30, and the prescaler 40 are shown in greater detail. The amplifier 20 may comprise a two-stage amplifier, including RF amplifiers 14 and 16 with nominal 50-ohm input and output impedances. The RF amplifier 16 represents the second stage of input amplification. Signal conditioning elements C1, C2, Cb1, R2, Cb2, and C4, together with amplifiers 14 and 16 produce amplified trigger pulses, one pulse per cycle of the signal. The prescaler 40 is shown with voltage feeding and impedance loading elements R6, CR2, CB3, R7, and CB4, and its output signal drives the frequency/pulse counter 50. The prescaler 40 and counter 50 may comprise components known to a practiced artisan. The modulator 30 is outlined in FIG. 3 and preferably comprises resistance R4, R5, R9, capacitance C3–C5, PIN diode CR1, and transistor Q1. The transistor Q1 receives a modulator control signal from the microcontroller 60 to begin the modulation of the self-oscillating signal. The microcontroller 60 includes the correlator 62. The diode CR1 comprises a PIN diode which receives its required voltage to activate the modulator 30 from the microcontroller 60. The PIN diode CR1 acts like an RF switch, wherein it assumes a low RF impedance when a DC bias is applied. When the diode CR1 is activated, a capacitor C3, shown in series with the diode CR1, is switched in shunt with the RF path and the self-oscillation frequency is shifted slightly. The capacitor C3 preferably comprises approximately 2.7 pF.

In the fully developed product of the instant invention, the signal input is received through an antenna port 12, passed to the two-stage amplifier 20, and then to the modulator circuit 30. The signal is shifted, as shown in FIG. 1, when the correlator 62 provides the required bias voltage to the PIN diode CR1 through the transistor switch Q1. The counter 50 and microcontroller 60 are conventionally known and their particular implementation is used in combination with the modulator 30 in accordance with the instant invention.

FIG. 3 provides a system level schematic of the instant invention. With reference to FIG. 3, amplifiers 14 and 16 comprise RF amplifiers having nominally 50-ohm input and output impedance. The prescaler 40 preferably comprises a divide-by-eight prescaler integrated circuit and resistors R6–R8, zener diode CR2, capacitors C4, Cb3, and Cb4, and a 5-volt supply. The output of the prescaler 40 is received by the counter 50. The frequency of the input signal is divided by the division ratio of the prescaler 40, such as eight, so as to allow the counter to more easily read or count pulses. The prescaler IC 40 may comprise other division ratios, such as 2, 4, 16, 32, etc. The PIN diode CR1, shown in modulator circuit 30, is used to switch the series capacitor C3 in shunt with the RF signal line. This allows the self-oscillation frequency to be shifted by the modulator circuit. The capacitors referenced by "Cb" refer to bypass capacitors used for establishing an AC and RF ground and for allowing DC voltage biasing. Capacitors C1, C2, and C4 comprise coupling capacitors between the various stages of the circuit, that is, the amplifier 20, the modulator 30, and prescaler 40. The capacitor C5 and resistor R5 together provide a low pass filter to eliminate any noise present at the digital output from the microcontroller so as to prevent it from reaching the RF stages and interfering with input signals. The resistors R1–R3 and R10 are ballasting resistors used for dividing the 5-volt voltage supply to lower values in the amplifiers 14, 16. The resistor R4 in addition to the resistor R5, collectively limit the drive current to the PIN diode CR1. The resistor R6 and diode CR2 provide a simple zener shunt regulator for dropping the voltage supply to the required level needed by the prescaler IC. Preferably, the voltage supply is dropped from 5 volts to 3 volts. The resistor R7 establishes a DC bias on each of the prescaler ICs 40 differential inputs. Finally, resistor R9 discharges capacitor C5 when the microcontroller output goes low.

With reference to FIG. 4, a flow chart of the process used by the microcontroller 60 for determining valid measurements is shown and referenced by numeral 100. In block 102, the microcontroller 60 moves the dither signal to the opposite state from the present state. Next, the microcontroller 60 takes a frequency measurement and compares it to the previous measurement result stored in the stack. If the result is within the predetermined tolerance of previous results, then the frequency is considered valid and stored in memory. If the comparison is not within the predetermined tolerance is not valid, then the count's measurement is pushed into a stack location for comparing with subsequent measurements. Accordingly, the oldest count result is discarded so as to make room for the latest result. The loop is then repeated as long as the frequency counter is active. The valid result stored in memory may be displayed to the operator or used in variety of ways.

The instant invention has been shown and described herein in what is considered to be the most practical and preferred embodiment. It is recognized, however, that departures may be made therefrom within the scope of the invention and that obvious modifications will occur to a person skilled in the art.

What is claimed is:

1. A frequency counter for accurately determining the frequency of a valid periodic RF input signal of interest, said frequency counter distinguishing the frequency count of said valid periodic RF input signal from undesired self-oscillations, said frequency counter comprising:

(a) signal input means for receiving successive signal samples, the signal samples including the valid periodic RF input signal and the undesired self-oscillations;

(b) frequency measuring means, electrically associated with said signal input means, for measuring the frequency of the signal samples over a predetermined period of time so as to obtain a plurality of frequency counts;

(c) means for separating the signal samples to obtain successive frequency counts and to facilitate isolation of the valid periodic RF input signal from the undesired self-oscillations, said separating means being in electrical communication with said signal input means and said frequency measuring means.;

(d) correlating means, electrically communicated with said frequency measuring means and said separating means, for calculating a difference in frequency measurements between said successive frequency counts and for comparing said difference in said frequency counts to a preselected value, wherein a valid periodic RF input signal is deemed measured when said preselected value exceeds said difference; and (e) frequency display means, electrically associated with said correlating means, for displaying said frequency measurement of said valid periodic RF input signal.

2. The frequency counter of claim 1, wherein said separating means comprises:

modulator means, in electrical communication with said correlating means and said signal input means, for selectively shifting the phase of signal samples selected from said successive signal samples, wherein the frequency count of the shifted signal sample is compared to the frequency count of a non-shifted signal sample by said correlating means.

3. The frequency counter of claim 2, further comprising control signal generating means for providing an enabling signal to said modulator means so as to enable said modulator means to shift the phase of said selected signal samples.

4. The frequency counter of claim 3, wherein said correlating means and said control signal generating means are defined by a microcontroller having a set of executable instructions for comparing the successive frequency counts and for selectively enabling said modulator means.

5. The frequency counter of claim 3 wherein said modulator means includes:

a low pass filter in electrical communication with said signal input means; and an enabling means, in electrical communication with said control signal generating means, for enabling said modulator when receiving said enabling signal.

6. The frequency counter of claim 1, further comprising amplifying means electrically coupled to said input means for amplifying said signal samples to improve the efficiency of said frequency measuring means in detecting threshold crossings.

7. The frequency counter of claim 6, further comprising signal conditioning means electrically associated with said amplifying means for converting said signal samples into a series of electronic trigger pulses, each said trigger pulse representing a cycle of said signal and having an amplitude sufficient for detection by said frequency measuring means.

8. The frequency counter of claim 7, further comprising:

a microcontroller means in electrical communication with said modulator means and said frequency measuring means for selectively providing an enabling signal to said modulator means, said correlating means and said control signal generating means being defined by said microcontroller, said microcontroller storing said successive frequency counts for comparing and selectively displaying individual frequency counts when a valid periodic RF input signal is determined.

9. The frequency counter of claim 1 wherein said correlating means includes a microcontroller for storing said frequency counts of said successive signal samples and for thereafter arithmetically comparing said successive frequency counts.

10. The frequency counter of claim 9 wherein said microcontroller includes a storing means for storing said frequency counts of said signal samples and for comparing said frequency counts to arrive at said difference.

11. A frequency counter for determining the frequency of a valid low-level periodic RF input signal of interest having self-oscillations, said frequency counter distinguishing the frequency count of said main periodic RF input from the frequency count of the self-oscillation, said frequency counter comprising:

(a) signal input means for receiving signal samples, the signal samples including a at least a first signal sample and a second signal sample;

(b) frequency measuring means, electrically associated with said signal input means, for measuring the frequency of said signal samples, including the first signal sample and the second signal sample, so as to obtain at least a first frequency count and a second frequency count corresponding to said first and second signal samples;

(c) modulator means, in electrical communication with said signal input means, for selectively shifting the phase of the second signal sample received, when said modulator means is enabled and prior to measuring the frequency count of the second signal sample, so as to facilitate isolation of the valid periodic RF signal input from the undesired self-oscillations;

(d) correlating means, electrically associated with said frequency measuring means and said modulator means, for calculating a difference between said first frequency count and said second frequency count and for comparing said difference to a preselected value; and (e) frequency display means, electrically associated with said correlating means, for displaying frequency counts when said difference is less than said preselected value.

12. A frequency counter according to claim 11, wherein said signal input means comprises:

pulse generating means for converting said signal samples received into trigger pulses having sufficient amplitude for triggering frequency counts in said frequency measuring means.

13. A frequency counter according to claim 13, wherein said signal input means further comprises:

amplifier means, in electrical communication with said pulse generating means, for converting said signal samples received into a series of electronic trigger pulses, each said trigger pulse representing a cycle of said signal samples.

14. The frequency counter of claim 11, further comprising a control signal generating means for selectively providing an enabling signal to said modulator means to selectively enable said modulator means to shift said second signal sample.

15. A frequency counter according to claim 14, wherein said correlating means and said control signal generating means are defined by a microcontroller having a set of executable instructions.

16. A frequency counter according to claim 15, wherein said modulator means comprises a control signal receiving means in communication with said modulator enabling means for receiving said control signal from said microcontroller so as to enable said modulator means.

17. A frequency counter according to claim 16, further comprising a frequency dividing means, in electrical communication with said frequency measuring means and said signal input means, for dividing the number of cycles of said signal samples by a predetermined factor to enable said frequency measuring means to accurately count said trigger pulses.

18. A frequency counter according to claim 17, wherein said microcontroller set of executable instructions includes a pulse count compensating means for readjusting trigger pulse counts in proportion to the division by said frequency division means.

19. A frequency counter according to claim 17, wherein said modulator means is electrically connected to said microcontroller, said amplifier means, and said frequency division means.

* * * * *